United States Patent
Ishibashi et al.

(10) Patent No.: US 8,267,040 B2
(45) Date of Patent: Sep. 18, 2012

(54) PLASMA PROCESSING APPARATUS AND PLASMA PROCESSING METHOD

(75) Inventors: Kiyotaka Ishibashi, Amagasaki (JP); Junichi Kitagawa, Amagasaki (JP); Singo Furui, Amagasaki (JP); Cai Zhong Tian, Amagasaki (JP); Jun Yamashita, Amagasaki (JP); Nobuhiko Yamamoto, Amagasaki (JP); Tetsuya Nishizuka, Amagasaki (JP); Toshihisa Nozawa, Amagasaki (JP); Shinya Nishimoto, Amagasaki (JP); Tamaki Yuasa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1046 days.

(21) Appl. No.: 10/589,272

(22) PCT Filed: Feb. 15, 2005

(86) PCT No.: PCT/JP2005/002217
§ 371 (c)(1),
(2), (4) Date: Jun. 14, 2007

(87) PCT Pub. No.: WO2005/078782
PCT Pub. Date: Aug. 25, 2005

(65) Prior Publication Data
US 2007/0264441 A1 Nov. 15, 2007

(30) Foreign Application Priority Data

Feb. 16, 2004 (JP) .................................. 2004-037851

(51) Int. Cl.
*C23C 16/00* (2006.01)
*C23F 1/00* (2006.01)
*H01L 21/306* (2006.01)

(52) U.S. Cl. .... 118/723 MW; 118/723 R; 118/723 ME; 118/723 MR; 156/345.36; 156/345.41; 156/345.42

(58) Field of Classification Search .......... 118/723 MW, 118/723 R, 723 ME, 723 MR, 723 MA; 156/345.41
See application file for complete search history.

(56) References Cited

U.S. PATENT DOCUMENTS

| | | | | |
|---|---|---|---|---|
| 5,955,382 A * | 9/1999 | Yamauchi et al. | ............ | 438/726 |
| 6,091,045 A * | 7/2000 | Mabuchi et al. | ......... | 219/121.43 |
| 7,469,654 B2 * | 12/2008 | Ishibashi et al. | ...... | 118/723 MW |
| 2001/0050059 A1 * | 12/2001 | Hongo et al. | ......... | 118/723 MW |
| 2002/0066536 A1 * | 6/2002 | Hongoh et al. | .......... | 156/345.41 |
| 2004/0149741 A1 * | 8/2004 | Ishii et al. | ..................... | 219/678 |

FOREIGN PATENT DOCUMENTS

| | | |
|---|---|---|
| JP | 63-126196 | 5/1988 |
| JP | 8-106994 | 4/1996 |
| JP | 9-232099 | 9/1997 |

(Continued)

*Primary Examiner* — Rakesh Dhingra

(74) *Attorney, Agent, or Firm* — Oblon, Spivak, McClelland, Maier & Neustadt, L.L.P.

(57) ABSTRACT

In a plasma processing apparatus that processes a wafer in a process vessel by plasma generated by the supply of a microwave, a transmissive window has, in a center area of its lower surface, a hanging portion made of the same material as a material of the transmissive window. Between an outer peripheral surface of the hanging portion and a sidewall inner surface continuing from a support part, a gap is formed, the gap having a gap length of 0.5 to 10 mm, more preferably 0.5 to 5 mm. The generation of a strong electric field and plasma at a contact point is inhibited and an amount of sputtered particles, radicals, or the like reaching the wafer is also reduced.

2 Claims, 6 Drawing Sheets

FOREIGN PATENT DOCUMENTS

| | | |
|---|---|---|
| JP | 2000-273646 | 10/2000 |
| JP | 2002 299240 | 10/2002 |
| JP | 2003 059919 | 2/2003 |
| JP | 2003 168681 | 6/2003 |
| JP | 2004 259581 | 9/2004 |
| JP | 2004 311510 | 11/2004 |
| JP | 2005 063986 | 3/2005 |
| JP | 2005 100931 | 4/2005 |
| WO | WO 03/105544 | * 12/2003 |

* cited by examiner

PLASMA PROCESSING APPARATUS AND PLASMA PROCESSING METHOD

TECHNICAL FIELD

The present invention relates to a plasma processing apparatus and a plasma processing method.

BACKGROUND ART

Conventionally, there has been proposed plasma processing to apply processing, for example, CVD processing, etching processing, and the like, to a substrate in a process vessel by generating plasma in the process vessel through the use of a microwave.

A conventional plasma processing apparatus of this type using a microwave has a flat plate-shaped transmissive window made of a dielectric, for example, quartz or ceramics, to cover an upper opening of a process vessel, and in the process vessel, this transmissive window is supported by a support part supporting a peripheral edge portion of the transmissive window. On an upper face of the transmissive window, provided is a metal plate called, for example, a slot antenna, on which a large number of slots or slits are formed. The microwave is supplied to an area above the dielectric and the microwave leaking from the slots or slits generate an electric field under the transmissive window, so that process gas introduced into the process vessel turns into plasma, whereby predetermined plasma processing is performed (see Patent document 1).

However, in the method of generating the plasma by the microwave excitation as described above, a strong electromagnetic field standing wave is formed in the transmissive window, so that high-energy plasma by a strong electric field tends to be formed (here, referred to as "an edge effect") especially in a contact point between the transmissive window and the support part supporting the transmissive window (for example, in a peripheral edge portion of the support part on an inner side of the process vessel). This is because in an area near the dielectric, a microwave electric field is strong and thus electron temperature of the plasma gets higher, and if a surface of an object exists in this area, a potential difference increases to heighten irradiation energy of ions to this surface.

As a result, a member near the aforesaid contact point is sputtered by the plasma to adhere to a substrate being a processing target, which may possibly cause nonuniformity in processing rate of the processing target and deteriorate processing quality. Further, near the contact point, quality (for example, radical density, plasma density, or electron temperature) of plasma becomes different from quality of plasma generated in other portions of the transmissive window, which may possibly lead to nonuniform processing. Such a phenomenon becomes more distinguished in a case where power is increased for high-speed processing.

[Patent document 1] Japanese Patent Application Laid-open No. 2002-299240

DISCLOSURE OF THE INVENTION

Problems to be Solved by the Invention

The present invention was made in view of the above-described circumstances, and an object thereof is to prevent the aforesaid problem ascribable to the generation of a strong electric field and plasma near a contact point between a support part supporting a transmissive window and the transmissive window.

Means for Solving the Problems

To attain the above object, a plasma processing apparatus of the present invention includes: a transmissive window made of a dielectric to airtightly cover an upper opening of a process vessel; and a support part supporting, in the process vessel, a peripheral edge portion of the transmissive window, wherein the transmissive window has, in a center area thereof, a hanging portion made of a same material as a material of the transmissive window, and a gap with a predetermined distance or more is formed between an outer peripheral surface of the hanging portion and a sidewall inner surface of the process vessel continuing from the support part.

According to the plasma processing apparatus having such a characteristic, since the outer peripheral surface of the hanging portion, in the transmissive window, protruding downward functions as a kind of a shielding wall, it is possible to reduce an amount of particles radicals, and so on, which are sputtered by a strong electric field and plasma near the peripheral edge portion of the support part on the inner side of the process vessel, reaching a processing target. Moreover, a strong impedance change point occurs on a more inner side than the contact portion between the transmissive window and the support part, namely, on the outer peripheral surface of the hanging portion, and as a result, the microwave propagating outward from the inside of the transmissive window reflects thereon, so that electric field concentration in the peripheral edge portion of the support part on the inner side of the process vessel is alleviated, which can inhibit the generation itself of a strong electric field and high-density plasma in the peripheral edge portion of the support part on the inner side of the process vessel.

Preferably, the predetermined distance is 0.5 to 10 mm, more preferably, 0.5 to 5 mm, that is, preferably, the outer peripheral surface of the hanging portion and the support part or the sidewall inner surface of the process vessel continuing from the support part are apart from each other by 0.5 to 10 mm, more preferably, 0.5 to 5 mm. If this gap is narrow, a strong electric field is generated between the outer peripheral surface of the hanging portion and the sidewall inner surface of the process vessel continuing from the support part, as will be described in detail later, which makes it difficult to solve the aforesaid problem of the conventional art. If, on the contrary, the gap is too large, a shielding effect by the hanging portion is lost.

According to the findings of the inventors, the outer peripheral surface of the hanging portion protruding downward in a strong electric field, which will be a cause of abnormal discharge, near a contact point between the transmissive window and the support member functions as a sort of a shielding wall to inhibit the strong electric field near the peripheral edge portion of the support part on the inner side of the process vessel, and therefore, by making plasma enter and reach the vicinity of the contact point, it is possible to inhibit the generation of a strong electric field since this plasma neutralizes charge-up. In order for the plasma to exist in a small gap, a space large enough to allow the formation of at least a sheath therein has to exist.

In a case of microwave plasma, since electron density is $1 \times 10^{10}/cm^3$ to $1 \times 10^{12}/cm^3$, the sheath is a little less than 0.2 mm as shown in FIG. 1. Incidentally, the plasma at this time is argon plasma. Since the sheath has to be formed both on the hanging portion side and on the support member side, a width of the gap needs to be at least 0.4 mm. Considering an error at the time of manufacturing and assembly, a length equal to 0.5 mm or more is after all needed as the predetermined distance of the gap.

On the other hand, as for an upper limit of the length of the gap, if the length is too large, that is, if the gap is too large, this is equivalent to a state with no hanging portion and thus electron temperature of the plasma gets high. Therefore, the outer peripheral surface of the hanging portion and the support part or the sidewall inner surface of the process vessel continuing from the support part is preferably apart from each other by 0.5 to 10 mm, more preferably, 0.5 to 5 mm.

The outer peripheral surface of the hanging portion may be a tapered surface with the aforesaid gap gradually becoming larger toward a lower side. Thus forming the outer peripheral surface in the tapered shape makes it possible to alleviate the degree of the aforesaid reflection of the microwave, so that it is possible to prevent nonuniformity of the plasma density above the processing target, which may possibly be caused by excessive reflection.

A recessed portion may be formed in a center side area of the hanging portion. Consequently, a relatively protruding portion is formed on an outer side of the hanging portion of the transmissive window, whereby electric fields generated on respective lower surface sides of the recessed portion and the protruding portion can be made different in strength, which enables control of the plasma density above the processing target.

In such a case, a sidewall forming the recessed portion may also be a tapered surface inclining toward a center side of the recessed portion. This makes it possible to adjust the degree of the reflection of the microwave, enabling more delicate control of the plasma density.

If the width of the hanging portion exceeds $\lambda/4$ ($\lambda$ is a wavelength when the microwave propagates in the transmissive window), the microwave easily enters the inside of the hanging portion, which may possibly strengthen an electric field generated between the hanging portion and the support part. Therefore, the width of the hanging portion is preferably $\lambda/4$ or less, where $\lambda$ is a wavelength of the microwave in the transmissive window.

Further, considering the aforesaid function of the hanging portion as the shielding wall, L/D is preferably equal to 3 or more, where L is a vertical length of the hanging portion and D is the predetermined distance. Further, the vertical length of the hanging portion is preferably 20 mm or more, more preferably, 30 mm or more.

At least one of surfaces, in the support part or the sidewall continuing from the support part, facing the inside of the process vessel may be coated with $Y_2O_3$ (yttria). This can prevent direct sputtering of a material forming the support part and the occurrence of its contamination. Further, the $Y_2O_3$ (yttria) coating is preferably applied to a portion, in the support part or the sidewall continuing from the support part, exposed to the plasma in the process vessel.

According to another aspect of the present invention, a plasma processing apparatus of the present invention includes: a transmissive window made of a dielectric to airtightly cover an upper opening of a process vessel; and a support part supporting, in the process vessel, a peripheral edge portion of the transmissive window, wherein under the support part, an eave portion projecting into the process vessel is provided to be apart from a lower surface of the transmissive window by a predetermined distance or more.

When under the support part, the eave portion projecting into the processing vessel is thus provided to be apart from the lower surface of the transmissive window by a predetermined distance or more, since the eave portion functions as the aforesaid shielding wall to inhibit a strong electric field near the peripheral edge portion of the support part on the inner side of the process vessel and inhibit the sputtering by the plasma, it is possible to reduce an amount of particles, radicals, and the like reaching the processing target, and further since the concentration of the electric field in the peripheral edge portion of the support part on the inner side of the process vessel is alleviated, it is possible to inhibit the generation itself of a strong electric field and high-density plasma in the peripheral edge portion of the support part on the inner side of the process vessel.

Also in such a case, the predetermined distance is preferably 0.5 mm to 10 mm, more preferably 0.5 mm to 5 mm.

A plasma processing method of the present invention is a method using a plasma processing apparatus, the plasma processing apparatus including: a transmissive window made of a dielectric to airtightly cover an upper opening of a process vessel; and a support part supporting, in the process vessel, a peripheral edge portion of the transmissive window, wherein the transmissive window has, in a center area thereof, a hanging portion made of a same material as a material of the transmissive window, and a gap is formed between an outer peripheral surface of the hanging portion and a sidewall inner surface of the process vessel continuing from the support part, and the method including adjusting size of the gap to control strength of an electric field in a peripheral portion of the transmissive window.

As previously described, by adjusting the length of the gap between the outer peripheral surface of the hanging portion and the sidewall inner surface of the process vessel continuing from the support part, it is possible to adjust the strength of the electric field in the vicinity of the gap, so that it is possible to prevent an adverse effect of the aforesaid edge effect ascribable to the generation of the strong electric field and plasma in the vicinity of the contact point between the support part supporting the transmissive window and the transmissive window.

According to another aspect, a plasma processing method of the present invention is a method using a plasma processing apparatus, the plasma processing apparatus including: a transmissive window made of a dielectric to airtightly cover an upper opening of a process vessel; and a support part supporting, in the process vessel, a peripheral edge portion of the transmissive window, wherein the transmissive window has, in a center area thereof, a hanging portion made of a same material as a material of the transmissive window, and a gap is formed between an outer peripheral surface of the hanging portion and a sidewall inner surface of the process vessel continuing from the support part, and the outer peripheral surface is a tapered surface with the aforesaid gap gradually becoming larger toward a lower side, and the method including adjusting a taper angle of the tapered surface to control strength of an electric field in a peripheral portion of the transmissive window.

By thus forming the outer peripheral surface in the tapered shape, it is possible to alleviate the degree of the aforesaid reflection of the microwave, and by controlling the strength of the electric field in the contact point between the transmissive window and the support part supporting the transmissive window (for example, the peripheral edge portion of the support part on the inner side of the process vessel), it is possible to prevent the adverse effect of the aforesaid edge effect.

Effect of the Invention

According to the present invention, it is possible to prevent that a member in the vicinity of the contact point between the support part supporting the transmissive window and the transmissive window is sputtered by plasma due to the generation of a strong electric field and plasma in the vicinity of the contact point to adhere to a substrate being a processing target, and nonuniformity in processing rate of the processing target occurs to deteriorate quality of the processing.

Figure 1:
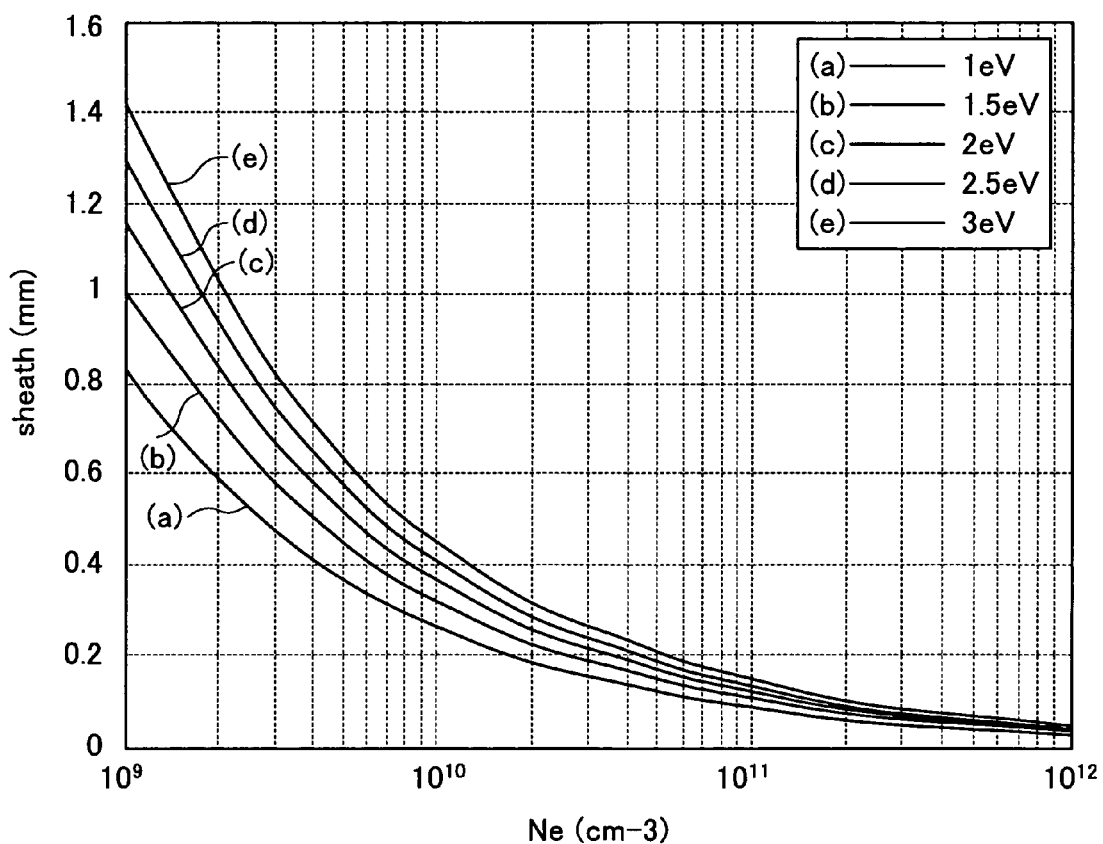
[FIG. 1] A graph showing the correlation between electron density and sheath length.

EXPLANATION OF CODES 1 plasma processing apparatus
2 process vessel
3 susceptor
5 sidewall
5a sidewall inner surface
6 support part
20 transmissive window
21 hanging portion
21a outer peripheral surface
C contact point
d, e gap
W wafer

BEST MODE FOR CARRYING OUT THE INVENTION

Figure 2:
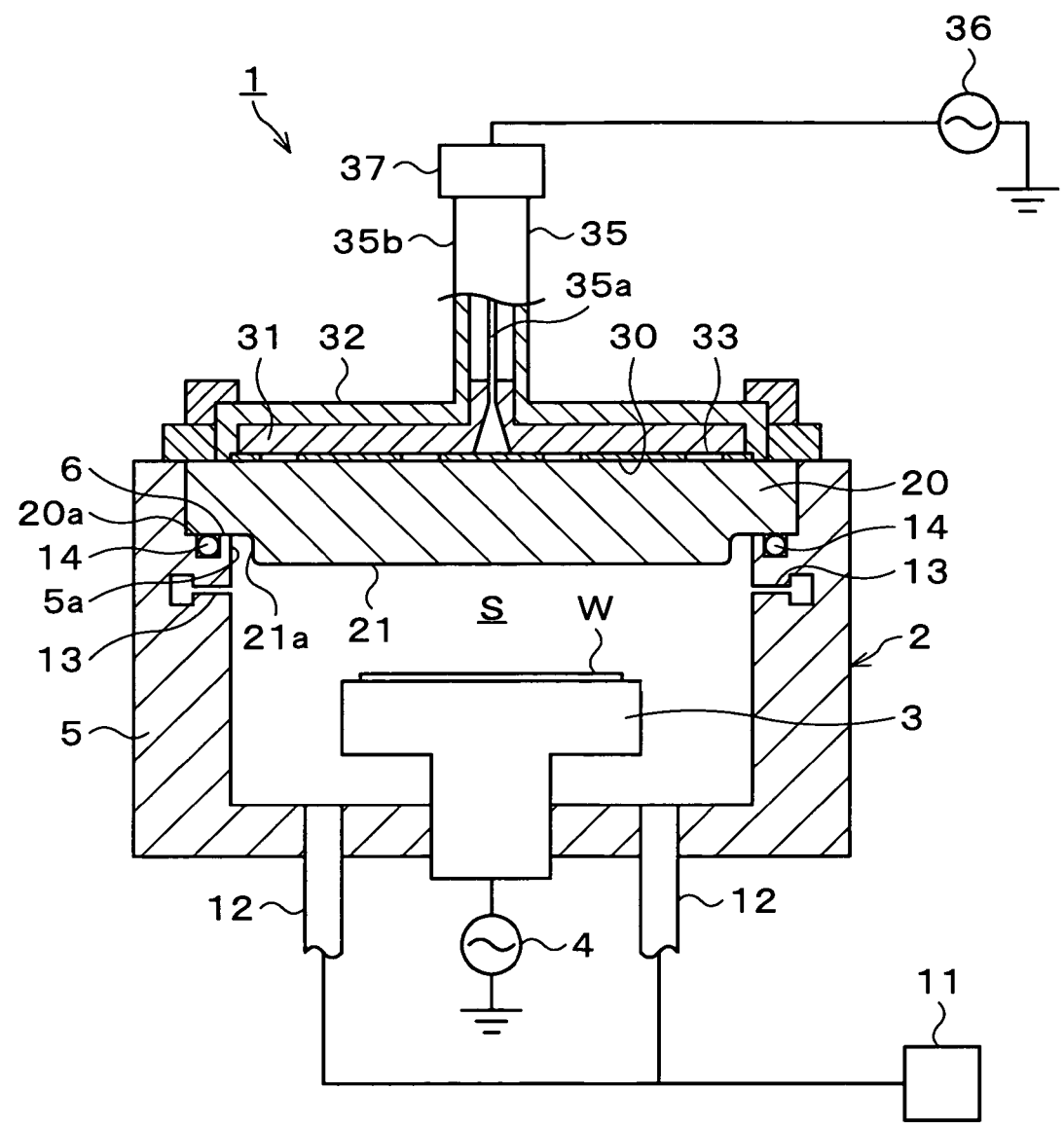
[FIG. 2] A vertical cross-sectional view of a plasma processing apparatus according to an embodiment.

Hereinafter, embodiments of the present invention will be described. FIG. 2 shows a state of a vertical cross section of a plasma processing apparatus 1 according to this embodiment, and this plasma processing apparatus 1 includes a process vessel 2 that has a bottomed cylindrical shape with an upper portion open and is made of, for example, aluminum. The process vessel 2 is grounded. On a bottom of the process vessel 2, provided is a susceptor 3 for placing thereon a substrate, for example, a semiconductor wafer (hereinafter, referred to as a wafer) W. The susceptor 3 is made of, for example, aluminum and is supplied with a high-frequency bias power from an AC power source 4 provided outside the process vessel 2.

In the bottom of the process vessel 2, provided are exhaust pipes 12 through which an atmosphere in the process vessel 2 is exhausted by an exhaust device 11 such as a vacuum pump. Further, in a sidewall of the process vessel 2, provided are gas introducing parts 13 such as, for example, gas nozzles, through which process gasses are supplied from process gas supply sources (not shown).

A transmissive window 20 made of, for example, quartz is provided in an upper opening of the process vessel 2 via a sealing member 14 such as an O-ring for ensuring airtightness. Instead of quartz, other dielectric material, for example, ceramics such as AlN or sapphire may be used. By this transmissive window 20, a process space S is formed in the process vessel 2. The transmissive window 20 has a circular plane section.

Above the transmissive window 20, an antenna member, for example, a disk-shaped slot antenna 30 is provided, and on an upper surface of the slot antenna 30, a retardation plate 31 and an antenna cover 32 covering the retardation plate 31 are further provided. The slot antenna 30 is formed of a thin disk made of a conductive material, for example, copper plated with Ag, Au, or the like, and has a large number of slits 33 arranged, for example, spirally or coaxially.

A coaxial waveguide 35 is connected to the antenna cover 32, and the coaxial waveguide 35 is composed of an inner conductor 35a and an outer tube 35b. The inner conductor 35a is connected to the slot antenna 30. A slot antenna 30 side of the inner conductor 35a has a conical shape so that a microwave propagates to the slot antenna 30 efficiently. The coaxial waveguide 35 guides a microwave of, for example, 2.45 GHz generated in a microwave supplier 36 so that the microwave propagates to the transmissive window 20 via a load matching device 37, the coaxial waveguide 35, the retardation plate 31, and the slot antenna 30. Then, by energy of the microwave, an electric field is formed on a bottom face of the transmissive window 20 and the process gas supplied into the process vessel 2 through the gas introducing part 13 is turned into plasma, whereby predetermined plasma processing, for example, deposition processing, etching processing, or the like is applied to the wafer W on the susceptor 3.

Figure 3:
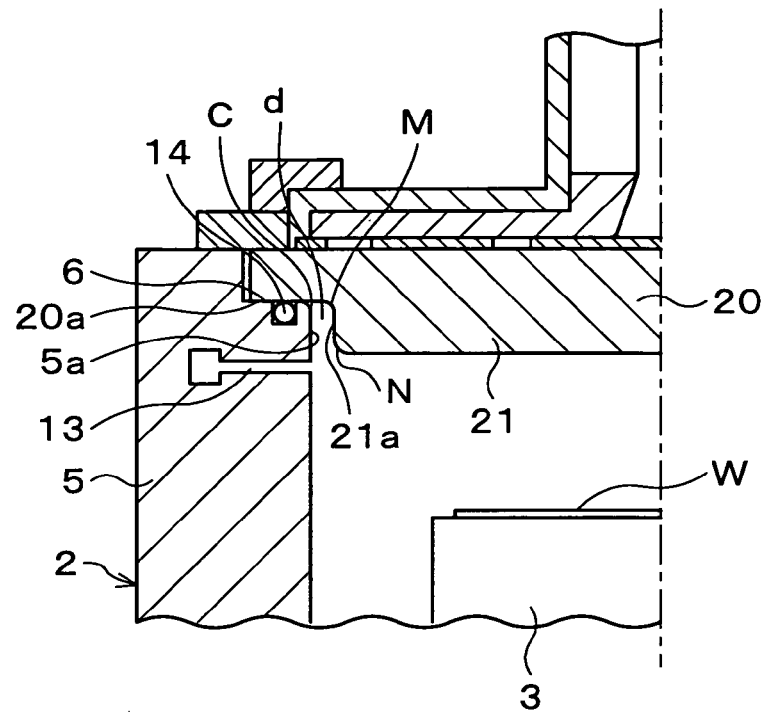
[FIG. 3] A vertical cross-sectional view showing the vicinity of a transmissive window of the plasma processing apparatus in FIG. 1.

The shape of the transmissive window 20 and a supported state thereof are as follows. That is, the transmissive window 20 has a shape in which a hanging portion 21 with uniform thickness protruding downward is formed in a center area of the bottom face side, namely, at least in a surface facing the substrate. A peripheral portion including a peripheral edge portion 20a of the transmissive window 20 is supported on an upper surface of a support part 6 constituted by a stepped part formed on an upper inner side of the sidewall 5 of the process vessel 2, so that the transmissive window 20 itself is supported. A gap d is formed, as shown also in FIG. 2, between an outer peripheral surface 21a of the hanging portion 21 and a sidewall inner surface 5a of the process vessel 2 continuing from the support part 6. A length of the gap d is set to 0.5 mm to 10 mm, preferably, 0.5 mm to 5 mm. As a result, a contact point C between the support part 6 and the transmissive window 20 does not come in direct sight from the wafer W on the susceptor 3, as shown in FIG. 3. Incidentally, the outer peripheral surface 21a of the hanging portion 21, corner portions M of a portion, in the transmissive window 20, supported by the support part 6, and corner portions N on the boundary between the outer peripheral surface of the hanging portion 21 and the lower surface of the hanging portion 21 are all formed of curved surfaces.

The plasma processing apparatus 1 according to this embodiment has the structure described above, and at the time of plasma processing, the wafer W is placed on the susceptor 3 in the process vessel 2, and the atmosphere therein is exhausted through the exhaust pipes 12 while predetermined process gas is supplied into the process vessel 2 from the gas introducing parts 13, whereby the inside of the process space S is set to a predetermined pressure. Then, the AC power source 4 applies the high-frequency bias power to the wafer W, the microwave supplier 36 generates the microwave, the microwave is introduced into the process vessel 2 via the transmissive window 20 to generate an electric field under the transmissive window 20, thereby turning the process gas in the process space S into plasma, and by selecting the kind or the like of the process gas, predetermined plasma processing, for example, various kinds of plasma processing such as etching processing, ashing processing, and deposition processing can be applied to the wafer W.

In the plasma processing apparatus 1 according to this embodiment, the hanging portion 21 made of the same material as the material of the transmissive window 20 is formed in the center area of the transmissive window 20, and the contact point C between the support part 6 and the transmissive window 20 does not come in direct sight from the wafer W on the susceptor 3, so that the hanging portion 21 functions as a shielding wall and thus it is possible to reduce an amount of particles, radicals, and the like, which are sputtered by the strong electric field and plasma in the vicinity of the contact C, reaching the wafer W. Owing to the existence of the hanging portion 21, since a strong impedance change point occurs on the outer peripheral surface 21a of the hanging portion 21, the microwave introduced via the transmissive window 20 reflects thereon, which alleviates electric field concentration in the contact point C and accordingly inhibits the generation itself of a strong electric field and high-density plasma in the vicinity of the contact point C.

Since the gap d with a thickness of 0.5 mm to 10 mm, more preferably 0.5 mm to 5 mm is formed between the outer peripheral surface 21a of the hanging portion 21 and the sidewall inner surface 5a continuing from the support part 6, a strong electric field is not generated in the gap d. Further, by adjusting the size (length) of the gap d, it is possible to control the concentration degree of the electric field, which as a result enables control of plasma density in a space under the transmissive window 20. Further, the outer peripheral surface 21a of the hanging portion 21, the corner portions M of the portion, in the transmissive window 20, supported by the support part 6, and the corner portions N on the boundary between the outer peripheral surface of the hanging portion 21 and the lower surface of the hanging portion 21 are all formed of curved surfaces, so that the concentration of the electric field in these portions is also inhibited.

As described above, according to the plasma processing apparatus 1 of this embodiment, there is no concern that the member near the contact point C between the support part 6 and the transmissive window 20 may be sputtered to adhere to the wafer W being the processing target or to cause nonuniformity in processing rate of the wafer W, and quality of the processing is not deteriorated. Moreover, by adjusting the size of the gap d, plasma density can be also controlled.

Figure 4:
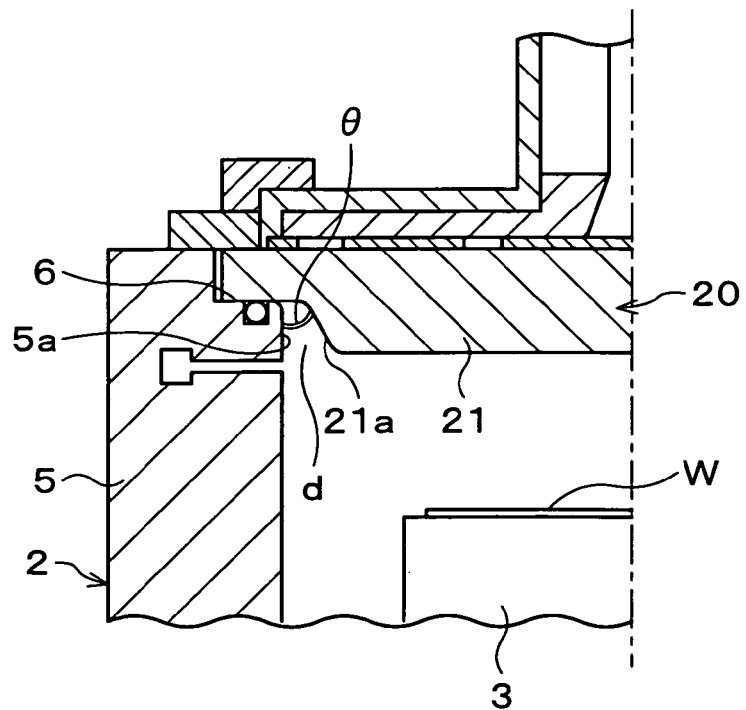
[FIG. 4] A vertical cross-sectional view of the vicinity of a transmissive window in which an outer peripheral surface of a hanging portion is a tapered surface.

In the plasma processing apparatus 1, the outer peripheral surface 21a of the hanging portion 21 of the transmissive window 20 is a vertical surface, that is, a surface parallel to the inner surface 5a of the sidewall 5, but as shown in FIG. 4, the outer peripheral surface 21a of the hanging portion 21 may be a tapered surface with the gap d gradually getting larger toward a lower side. In this structure, by adjusting an angle made by the outer peripheral surface 21a and the sidewall inner surface 5a, namely, a taper angle θ, it is possible to alleviate the degree of the reflection of the microwave in a peripheral portion of the transmissive window 20, and moreover, to control the concentration degree of the electric field in the peripheral portion of the transmissive window 20, so that plasma density of the peripheral portion can be controlled.

Figure 5:
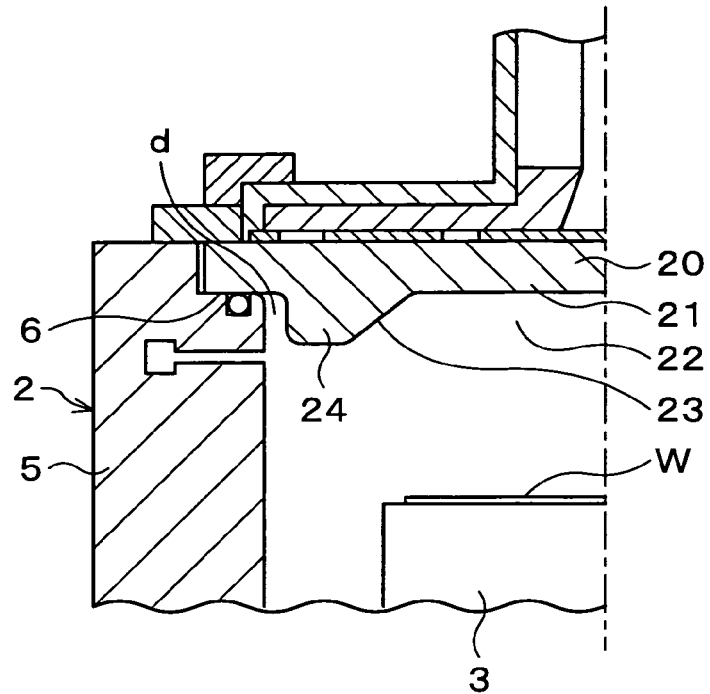
[FIG. 5] A vertical cross-sectional view of the vicinity of a transmissive window having a recessed portion in a center of the hanging portion.

As still another modification example, a transmissive window 20 shown in FIG. 5 can be proposed. This transmissive window 20 has a recessed portion 22 formed in a center side area of a hanging portion 21. A sidewall 23, in the transmissive window 20, forming the recessed portion 22 and facing the recessed portion 22 is a tapered surface inclining toward the center side of the recessed portion 22.

With such a structure, a relatively protruding portion 24 is formed on an outer side of the hanging portion 21 of the transmissive window 20, so that electric fields generated on lower surface sides of the recessed portion 22 and the protruding portion 24 can be made different in strength, which enables control of plasma density above the wafer W. In addition, since the sidewall 23 is a tapered surface, the degree of the reflection of the microwave can be further adjusted by the sidewall 23 portion, so that more delicate and complicated control of plasma density is enabled and plasma uniformity can be improved.

Figure 6:
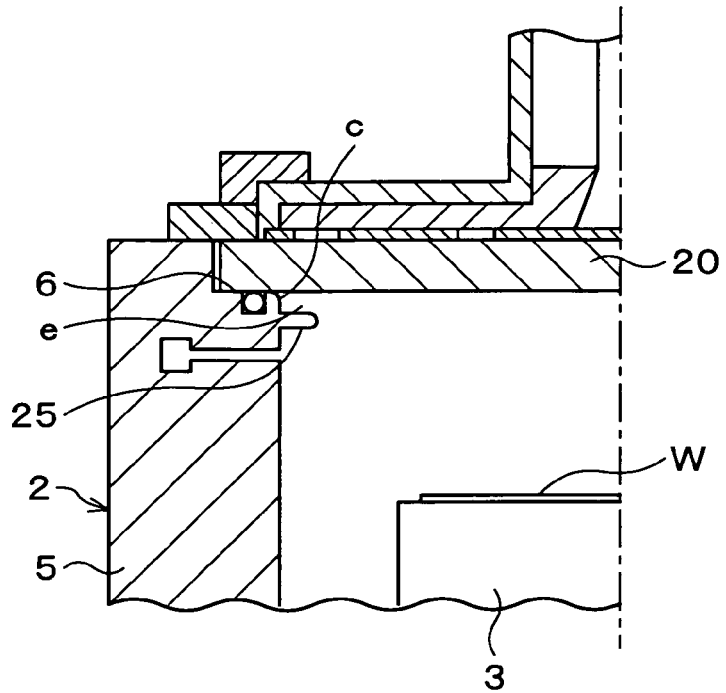
[FIG. 6] A vertical cross-sectional view showing the vicinity of a transmissive window of a plasma processing apparatus having an eave portion on an inner side of a sidewall of a process vessel.

According to the above-described embodiment, the adverse effect due to the concentration of the electric field in the contact point C is prevented by providing the hanging portion 21 in the transmissive window 20, but as shown in FIG. 6, an eave portion 25 projecting into the process vessel 2 may be provided on an inner side of the sidewall 5 under the support part 6 so as to be apart from the lower surface of the transmissive window 20 by a gap e with a predetermined distance or more. In such a case, preferably, the length of the eave portion 25 and the size (length) of e are set so that the contact point C is shielded by the eave portion 25 and the contact point C does not come in direct sight from the wafer W. However, the size of the gap e itself is preferably 0.5 mm to 10 mm, more preferably 0.5 mm to 5 mm.

Consequently, the eave portion 25 functions as the shielding wall as previously described to inhibit a strong electric field in the vicinity of the contact point C and prevent sputtering by plasma, so that an amount of particles, radicals, and the like reaching the wafer W can be reduced, and in addition, the concentration of the electric field in the peripheral edge portion of the support part on the inner side of the process vessel is alleviated, so that the generation itself of the strong electric field and high-density plasma in the peripheral edge portion of the support part on the inner side of the process vessel can be prevented.

Incidentally, as for the vertical length of the hanging portion 21, which will be described with reference to the example in FIG. 7, a vertical length L of the hanging portion 21 is preferably 20 mm or more, more preferably 30 mm or more. As in FIG. 7, the sidewall 23 on the recessed portion 22 side of the hanging portion 21 need not be a tapered surface as described above, but may be a vertical surface as in FIG. 7.

Figure 8:
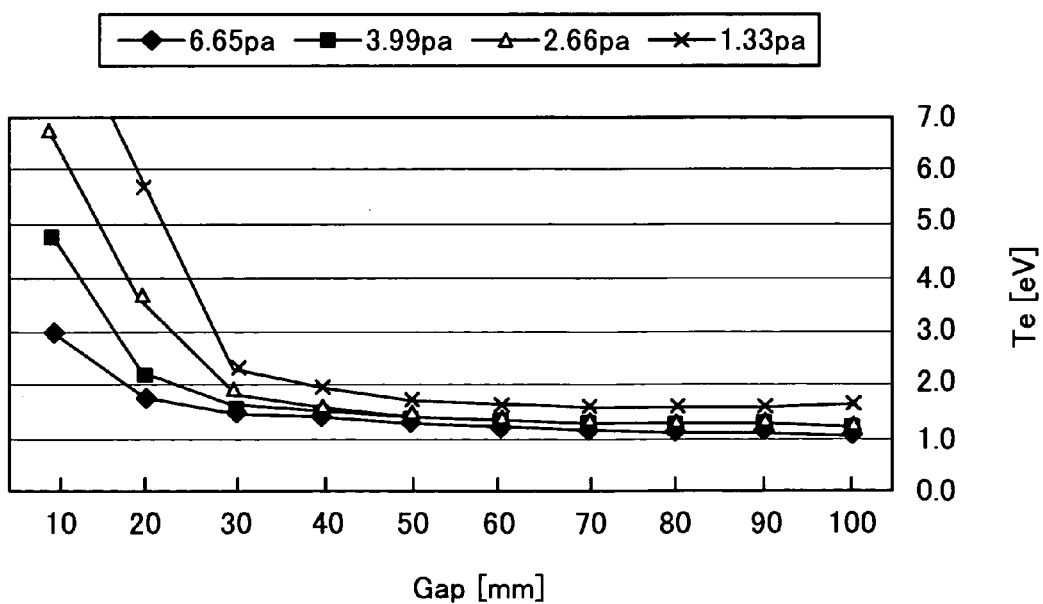
[FIG. 8] A graph showing the correlation between gap length and electron temperature.
Figure 9:
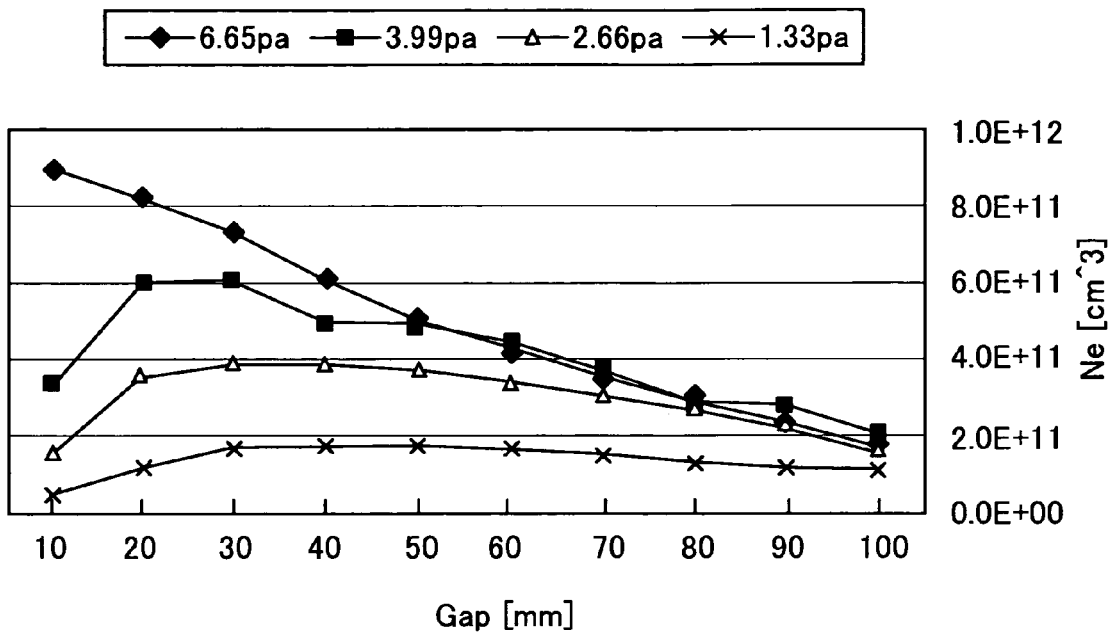
[FIG. 9] A graph showing the correlation between gap length and electron density.

FIG. 8 is a measurement graph showing the correlation between distance (horizontal axis) from the transmissive window 20 and electron temperature in microwave plasma, and FIG. 9 is also a measurement graph showing the correlation between this distance and electron density. As is seen from the results, the electron temperature is especially high at a place whose distance from the transmissive window 20 is 10 mm or less, and at the distance of 10 to 20 mm, electron temperature is relatively high if the pressure is low, and therefore, the distance is more preferably set to 20 mm or more.

Figure 7:
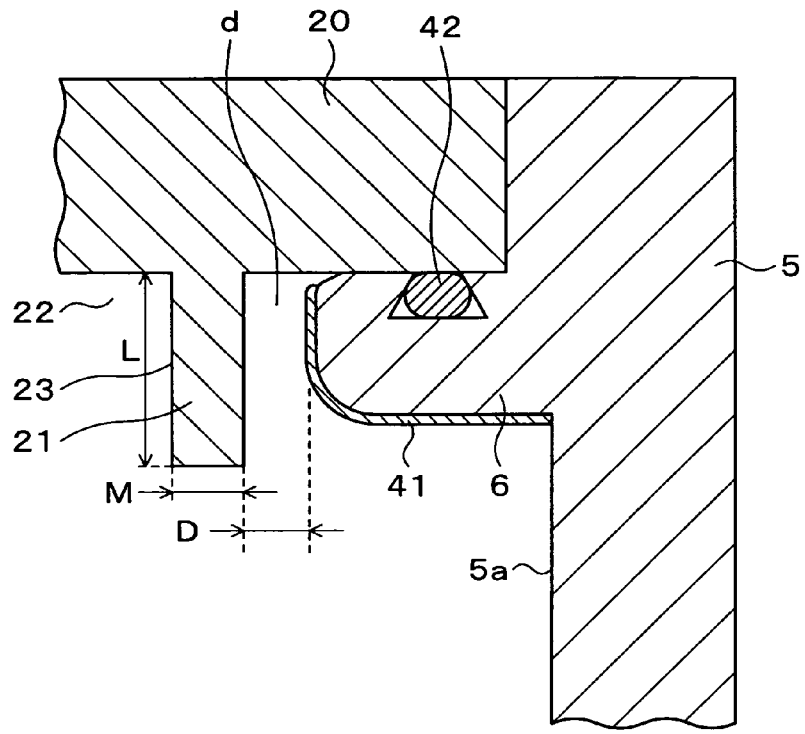
[FIG. 7] An enlarged cross-sectional view of the vicinity of a contact point between a transmissive window and a support part in another embodiment.

Further, as shown in FIG. 7, on at least one of surfaces, in the support part 6 and the sidewall inner surface 5a continuing from the support part 6, facing the inside of the process vessel 2, a coating part 41 of $Y_2O_3$ (yttria) superior in plasma resistance may be formed. The coating part 41 is preferably formed by a method such as plasma thermal spraying, CVD, sputtering, or ion plating. This improves resistance of the support part 6 against sputtering by plasma. 42 in FIG. 7 denotes a sealing member such as an O-ring.

Preferably, the $Y_2O_3$ (yttria) coating part 41 is formed from a portion apart from an effective tangential line, in an effective contact surface with the transmissive window 20, by at least 0.5 mm or more, on at least surfaces facing the inner side of the process vessel 2 and continuing from the support part 6. However, the coating part 41 is not in physical contact with the effective contact surface and the transmissive window 20, and a gap therebetween is preferably smaller than 0.2 mm, more preferably, 0.05 mm or less.

The inventors actually conducted an experiment on a process vessel in which the hanging portion 21 is not formed and the support part 6 is made of Al, and as a result, the following results were obtained for a case where the surface of the support part 6 was not coated with $Y_2O_3$ and for the case where it was coated with $Y_2O_3$. In the case where the support part 6 was not coated with $Y_2O_3$, an element of contamination was Al and an amount thereof was $400 \times 10^{10}/cm^2$. On the other hand, in the case where the support part 6 was coated with $Y_2O_3$, a detected element of contamination was not Al but Y and an amount thereof was $28 \times 10^{10}/cm^2$. Owing to high plasma resistance of $Y_2O_3$, the amount of metal contamination was reduced by one digit.

As a result of studies in which the effect of the hanging portion 21 was evaluated in view of the contamination amount, the following results were obtained. In a case where the hanging portion 21 was not formed in the structure example in FIG. 7, a contamination amount of Al was $16 \times 10^{10}/cm^2$, and a contamination amount of Y was $28 \times 10^{10}/cm^2$. On the other hand, in the case where the hanging portion 21 was formed as in FIG. 7, when the gap length D was 2 mm, a contamination amount of Al was $7.5 \times 10^{10}/cm^2$, and a contamination amount of Y was $0.61 \times 10^{10}/cm^2$. In both cases, argon plasma was generated and a process pressure was 6.65 Pa (5 mTorr).

As described above, in view of contamination, in the case where the hanging portion 21 is formed, a remarkable reduction in its generation amount can be confirmed.

Incidentally, in the example shown in FIG. 7, the support part 6 protrudes toward the inner side of the process vessel 2 from the sidewall 5 of the process vessel 2, and in such a form, the aforesaid effects of the present invention can be similarly obtained.

As for the width of the hanging portion, which will be described based on FIG. 7, when the width M exceeds $\lambda/4$ ($\lambda$ is a wavelength when the microwave propagates in the transmission window), the microwave easily enters the inside of the hanging portion 21 from the transmissive window 20, which may possibly generate a strong electric field between the hanging portion 21 and the support part 6, and therefore, the width M of the hanging portion 21 is preferably $\lambda/4$ or less.

Further, considering the function of the hanging portion 21 as the shielding wall, the gap d and the length of the hanging portion, which will be described based on FIG. 7, preferably satisfy the relation such that L/D is equal to 3 or more, where D is a predetermined distance of the gap d (gap length) and L is the vertical length of the hanging portion 21.

Example 1

Figure 10:
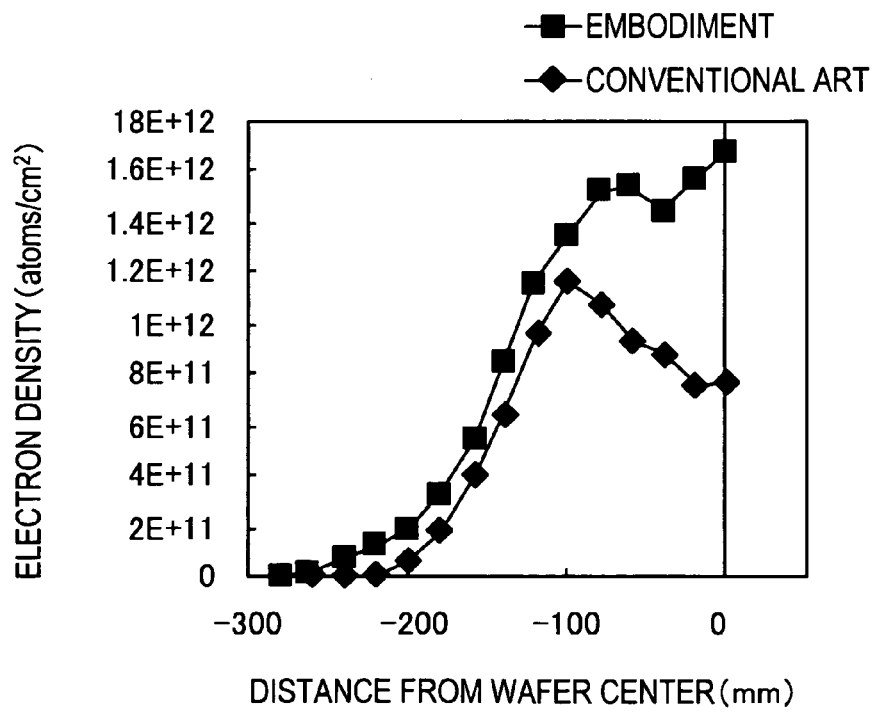
[FIG. 10] A graph showing the distribution of electron density on a wafer in oxide film forming processing in the embodiment and in a conventional art.

The distribution of electron density was measured from a center to an edge on the wafer W when formation processing of an oxide film was carried out by using the plasma processing apparatus 1 having the transmissive window 20 shown in FIG. 4, and by a conventional art, that is, by using a plasma processing apparatus in which no hanging part 21 is formed and the peripheral portion of the transmissive window 20 with uniform thickness is supported by the support part 6, and FIG. 10 shows the comparison result.

As process conditions, mixed gas whose flow ratio was $Ar/O_2/H_2=500/5/5$ (sccm) was used as process gas, the pressure inside the process vessel 2 was 133 Pa, and power of the microwave was 4500 W.

As shown by the graph in FIG. 10, in the conventional art, the electron density in the center portion of the wafer W is relatively low and uniformity of the oxide film forming rate (uniformity in the wafer surface) was 3.5%. A possible reason for this may be that the edge effect influenced the plasma density. On the other hand, when the plasma processing apparatus 1 having the transmissive window 20 shown in FIG. 4 was used for the processing, the electron density at the center portion of the wafer W did not lower and uniformity in the oxide film forming rate was 1.8%. This is because as a result of a reduced edge effect, a loss of power of the microwave decreased and as a result, plasma density as a whole improved, which improved plasma density at the center portion relative to the peripheral area. Therefore, it is seen that in the present invention, the edge effect was reduced and more uniform processing was enabled.

INDUSTRIAL APPLICABILITY

The present invention is useful for realizing uniform processing of a plasma processing apparatus having, in a process vessel, a support part supporting a transmissive window made of a dielectric.

What is claimed is:

1. A plasma processing apparatus comprising:
   a process vessel in which a substrate is processed;
   a gas introducing part that introduces process gas into said process vessel;
   a transmissive window including a dielectric to airtightly cover an upper opening of the process vessel;
   an antenna member, located above the transmissive window, that introduces a microwave into the process vessel;
   a support part supporting a peripheral edge portion of said transmissive window; and
   an exhaust pipe that exhausts an atmosphere in the process vessel via an exhaust device,
   wherein under said support part, an eave portion that is separate from a gas supply nozzle disposed in a sidewall of the process vessel, and projects from the sidewall of the process vessel toward an interior of the process vessel, and is separate from a contact point between the support part and a lower surface of said transmissive window by a predetermined vertical distance on an entire surface of the sidewall in a circumferential direction, and
   wherein the predetermined distance is set to 0.5 to 10 mm.

2. The plasma processing apparatus according to claim 1, wherein the predetermined distance is 0.5 to 5 mm.

* * * * *